United States Patent
Chung et al.

(10) Patent No.: US 8,115,537 B2
(45) Date of Patent: Feb. 14, 2012

(54) METHOD AND APPARATUS FOR SUPPRESSING NOISE CAUSED BY PARASITIC CAPACITANCE AND/OR RESISTANCE IN AN ELECTRONIC CIRCUIT OR SYSTEM

(75) Inventors: Shu Hung Henry Chung, Hong Kong (HK); Wai To Yan, New Territories (HK)

(73) Assignee: City University of Hong Kong, Kowloon (HK)

( * ) Notice: Subject to any disclaimer, the term of this patent is extended or adjusted under 35 U.S.C. 154(b) by 490 days.

(21) Appl. No.: 12/435,941

(22) Filed: May 5, 2009

(65) Prior Publication Data
US 2010/0283436 A1 Nov. 11, 2010

(51) Int. Cl.
H03B 1/00 (2006.01)
H03K 5/00 (2006.01)
H04B 1/10 (2006.01)

(52) U.S. Cl. ...... 327/551
(58) Field of Classification Search ...... 327/551
See application file for complete search history.

(56) References Cited

U.S. PATENT DOCUMENTS

| | | | | |
|---|---|---|---|---|
| 1,920,948 | A | 8/1933 | Crouse | 178/44 |
| 5,038,263 | A | 8/1991 | Marrero et al. | 363/20 |
| 6,476,689 | B1 | 11/2002 | Uchida et al. | 333/177 |
| 6,937,115 | B2 | 8/2005 | Perreault et al. | 333/177 |
| 7,180,389 | B2 | 2/2007 | Wang et al. | 333/181 |
| 7,242,269 | B2 | 7/2007 | Perreault et al. | 333/177 |
| 2007/0087710 | A1* | 4/2007 | Chou et al. | 455/127.4 |
| 2007/0188265 | A1 | 8/2007 | Perreault et al. | 333/181 |
| 2008/0111632 | A1* | 5/2008 | Gong et al. | 330/310 |
| 2008/0204126 | A1 | 8/2008 | Wang et al. | 327/551 |

FOREIGN PATENT DOCUMENTS
WO  WO 2007/094921  8/2007

OTHER PUBLICATIONS

Erickson, R.W. and Maksimovic, D., "Fundamentals of Power Electronics," Norwell, Mass., Kluwer Academic, c2001.
Krein, P. T., "Nonlinear Phenomena in Power Electronics: Attractors, Bifurcation, Chaos, and Nonlinear Control," New York, IEEE Press, 2001, Chap. 8.
Mattingly, Doug, "Designing Stable Compensation Networks for Single Phase Voltage Mode Buck Regulators," Intersil Technical Brief TB 417.1, Dec. 2003.

(Continued)

*Primary Examiner* — Lincoln Donovan
*Assistant Examiner* — Daniel Rojas
(74) *Attorney, Agent, or Firm* — Heslin Rothenberg Farley & Mesiti P.C.

(57) ABSTRACT

Reducing, suppressing or canceling parallel parasitic capacitance and/or resistive effects that affect the frequency response of components, elements and/or circuits in an electronic circuit or system that exhibit inductance is disclosed. Noise generated by parallel parasitic capacitance and/or parasitic resistance of the components, the physical orientation of the components, and/or the layout of components, devices and/or conductive tracks (board traces) on printed circuit boards within an electronic circuit or system is reduced, suppressed or canceled. The reduction, suppression or cancelation is achieved by adding a current source in parallel with a part or component of the electronic circuit or system that exhibits inductance, the current source being adapted to deliver a compensating current of roughly equal magnitude and roughly opposite phase to parasitic current associated with the part or component.

19 Claims, 6 Drawing Sheets

OTHER PUBLICATIONS

Farkas, et al., "Viability of Active EMI Filters for Utility Applications," IEEE Transactions on Power Electronics, vol. 9, No. 3, May 1994, pp. 328-337.

Hamill, David C., "An Efficient Active Ripple Filter for Use in Dc-Dc Conversion," IEEE Transactions on Aerospace Electronic System, vol. 32, No. 3, Jul. 1996, pp. 1077-1084.

Lin, Y. H., Zheng, K. L., and Chen, K. H., "Smooth Pole Tracking Technique by Power MOSFET Array in Low-Dropout Regulators," IEEE Trans. Power Electron., vol. 23, No. 5, Sep. 2008, pp. 2421-2427.

Lu, B. and Ooi, B., "Nonlinear Control of Voltage-Source Converter Systems," IEEE Trans. Power Electron., vol. 22, No. 4, Jul. 2007, pp. 1186-1195.

Ogasawara, et al., "An Active Circuit for Cancellation of Common-Mode Voltage Generated by a PWM Inverter," IEEE Transactions on Power Electronics, vol. 13, No. 5, Sep. 1998, pp. 835-841.

Poon, et al., "Techniques for Input Ripple Current Cancellation: Classification and Implementation," IEEE Transactions on Power Electronics, vol. 15, No. 6, Nov. 2000, pp. 1144-1152.

Smedley, K. M. and Ćuk, S., "One-cycle control of switching converters," IEEE Trans. Power Electron., vol. 10, No. 6, Nov. 1995, pp. 625-633.

Vlatković, et al., "Input Filter Design for Power Factor Correction Circuits," IEEE Transactions on Power Electronics, vol. 11, No. 1, Jan. 1996, pp. 199-205.

Wang, et al., "Common-Mode Noise Reduction for Power Factor Correction Circuit With Parasitic Capacitance Cancellation," IEEE Transactions on Electromagnetic Compatibility, vol. 49, No. 3, Aug. 2007, pp. 537-542.

Wang, et al., "Design of Inductor Winding Capacitance Cancellation for EMI Suppression," IEEE Transactions on Power Electronics, vol. 21, No. 6, Nov. 2006, pp. 1825-1832.

Wang, et al., "Inductor Winding Capacitance Cancellation Using Mutual Capacitance Concept for Noise Reduction Application," IEEE Transactions on Electromagnetic Compatibility, vol. 48, No. 2, May 2006, pp. 311-318.

* cited by examiner

FIG. 1 *PRIOR ART*

$r_L$ : EQUIVALENT PARALLEL RESISTANCE (EPR)

$C_L$ : EQUIVALENT PARALLEL CAPACITANCE (EPC)

*PRIOR ART*

METHOD AND APPARATUS FOR SUPPRESSING NOISE CAUSED BY PARASITIC CAPACITANCE AND/OR RESISTANCE IN AN ELECTRONIC CIRCUIT OR SYSTEM

CROSS-REFERENCE TO RELATED APPLICATIONS

This application contains subject matter which is related to the subject matter of the following applications, each of which is assigned to the same assignee as this application and filed on the same day as this application. Each of the below listed applications is hereby incorporated herein by reference in its entirety:

patent application Ser. No. 12/435,954, by Chung et al., entitled "METHOD AND APPARATUS FOR SUPPRESSING NOISE CAUSED BY PARASITIC INDUCTANCE AND/OR RESISTANCE IN AN ELECTRONIC CIRCUIT OR SYSTEM"; and patent application Ser. No. 12/435,979, by Chung et al., entitled "AN OUTPUT COMPENSATOR FOR A REGULATOR".

FIELD OF THE INVENTION

The present invention relates generally to components, elements and/or circuits for reducing or suppressing parasitic capacitance and/or resistive effects that affect the frequency response of the components, elements and/or circuits in an electronic circuit or system. The invention relates particularly to methods and apparatus for reducing, suppressing or even canceling noise generated by parasitic capacitance and/or parasitic resistance of the components, the physical orientation of the components, and/or the layout of components, devices and/or conductive tracks (board traces) on printed circuit boards within an electronic circuit or system.

BACKGROUND OF THE INVENTION

The increasing sophistication of electronic circuits and systems presents unique challenges for circuit designers. The operating frequency of modern electrical and electronic equipment continues to increase, in order to reduce the physical size and weight of the electronic circuits and systems. However, the trend is hindered by the possible generation of undesirable effects, such as ringing and resonance, due to parasitic effects associated with the components, the physical orientation of the components, and/or the layout of components, devices and/or conductive tracks on printed circuit boards within an electronic circuit or system. These parasitic elements degrade the high-frequency performance of the entire electronic circuit or system.

In electronic circuits and systems, parasitic capacitance is the unavoidable and usually unwanted capacitance that exists between the parts of an electronic component or circuit simply because of their proximity to each other. All actual circuit elements such as inductors, diodes, and transistors have internal capacitance, which can cause their behavior to depart from that of an 'ideal' circuit element. In addition, parasitic capacitance can exist between closely spaced conductors, such as wires or printed circuit board traces.

For example, an inductor often acts as though it includes a parallel capacitor, because of its closely spaced windings. When a potential difference exists across the coil, wires lying adjacent to each other at different potentials are affected by each other's electric field. They act like the plates of a capacitor, and store charge. Any change in the voltage across the coil requires extra current to charge and discharge these small 'capacitors'. When the voltage doesn't change very quickly, as in low frequency circuits, the extra current is usually negligible, but when the voltage is changing quickly the extra current is large and can dominate the operation of the circuit.

The parasitic capacitance between the base and collector of transistors and other active devices is a major factor limiting their high frequency performance. The screen grid was added to vacuum tubes in the 1930s to reduce parasitic capacitance between the control grid and the plate, and resulted in a great increase in operating frequency.

An inductor is one of the key components in the input and output filters of an electronic circuit or system. It is typically used as the series element to attenuate undesirable signals. However, its equivalent parallel capacitance (EPC) and equivalent parallel resistance (EPR) significantly affect the inductor's high frequency (HF) performance, causing non-ideal filter behavior.

Figure 1:
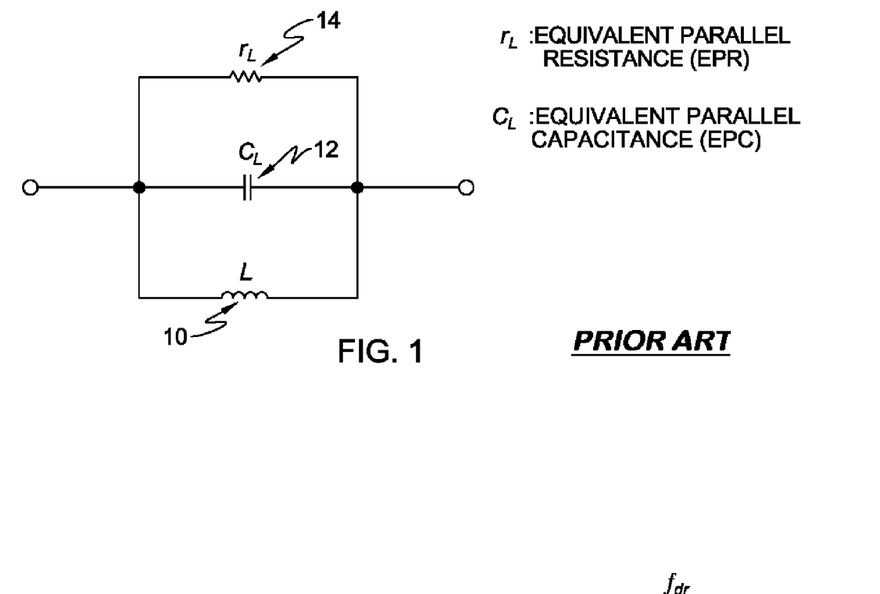
FIG. 1 is a schematic representation of a prior art high-frequency model for an inductor.
Figure 2:
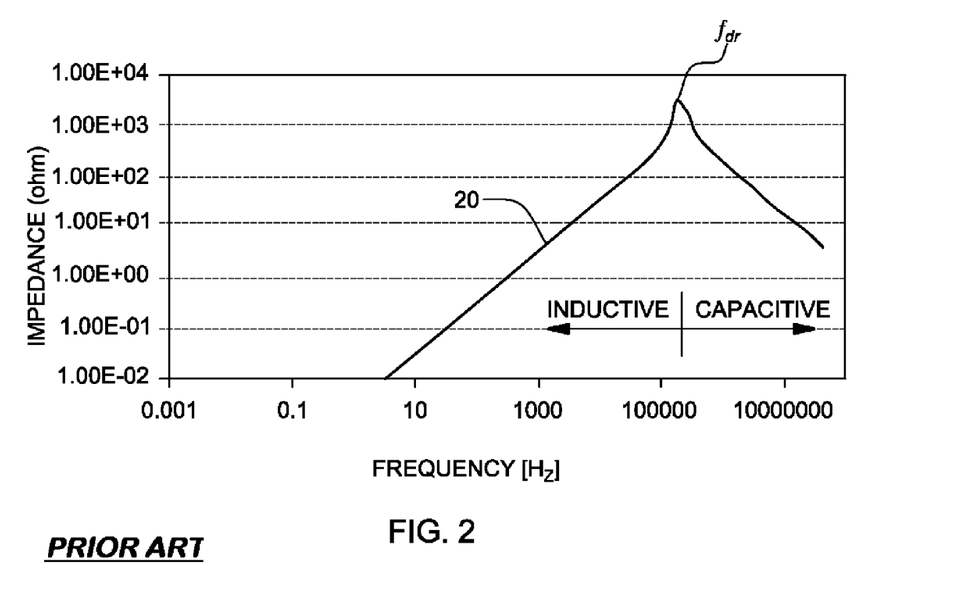
FIG. 2 is a graphical depiction of the magnitude of the impedance against operating frequency of the prior art inductor of FIG. 1.

FIG. 1 shows the schematic representation of a prior art high-frequency model for an inductor 10 comprising the inductor and its EPC 12 and EPR 14. The inductor 10 behaves like a capacitor when the operating frequency is higher than the damped resonance frequency of the inductor. The damped resonance frequency is determined by the inductance of the inductor, its EPC, and its EPR. FIG. 2 shows an impedance against operating frequency curve 20 for a 470 µH inductor, in which its EPC is 1 nF and its EPR is 100 kΩ. The damped resonance frequency $f_{dr}$ of the inductor coincides with the peak value of impedance as illustrated in FIG. 2. The inductor impedance is dominated by the EPC at high frequencies and its impedance decreases with the operating frequency.

Figure 3:
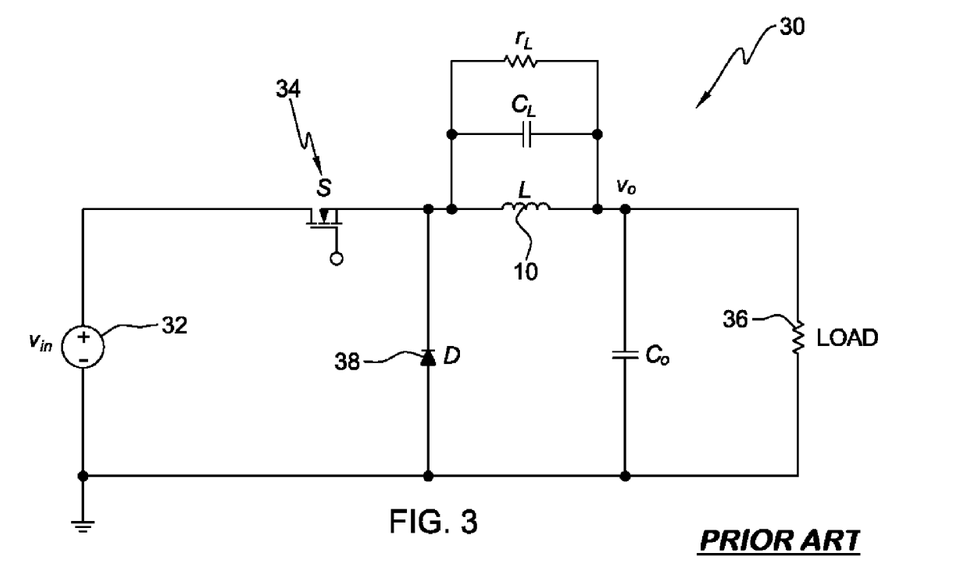
FIG. 3 is a circuit diagram showing a buck converter with a prior art inductor as the filter inductor.
Figure 4:
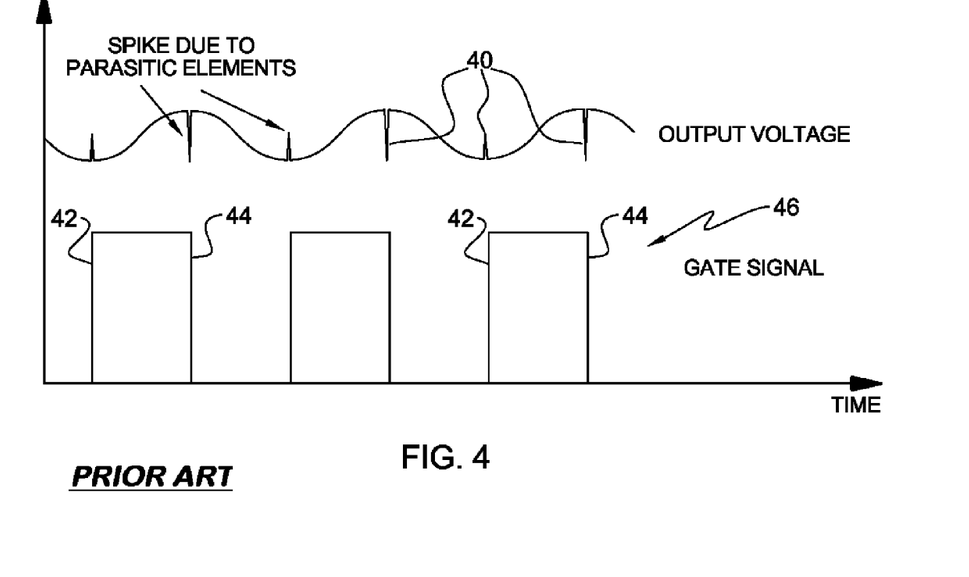
FIG. 4 is a graphical depiction of the effects of the parasitic elements on the output voltage of the buck converter of FIG. 3.

The EPC and EPR of the inductor will introduce undesired noise at the output of the filter, conducted noise at the input of the filter, and resonance with other components and parasitic elements in the circuit. FIG. 3 shows a buck converter 30 with a prior art inductor 10. The supply source 32 of the converter is $v_{in}$. The duty time of the switching element S 34 is adjusted to control the output voltage across the load 36. FIG. 4 depicts the effects of EPC and EPR on the output voltage of the buck converter 30. Due to the parasitic capacitance of the inductor 10, there appear voltage spikes 40 at the output which coincide with the leading and trailing edges 42, 44 of the gate signal 46 for controlling the main switch of the buck converter. When the main switching element 34 is on or off, the voltage across the diode 38 is changed. Thus, voltage spikes will then be coupled to the output through EPC. In order to eliminate such noise, it is crucial to cancel the effects caused by at least the EPC and preferably also the EPR.

There are two main approaches to canceling the effects of parasitic capacitances in a circuit or system. The first is based on canceling the parasitic capacitance of a particular component while the second one is based on canceling the effect caused by all parasitic capacitances in the entire circuit or system.

Figure 5:
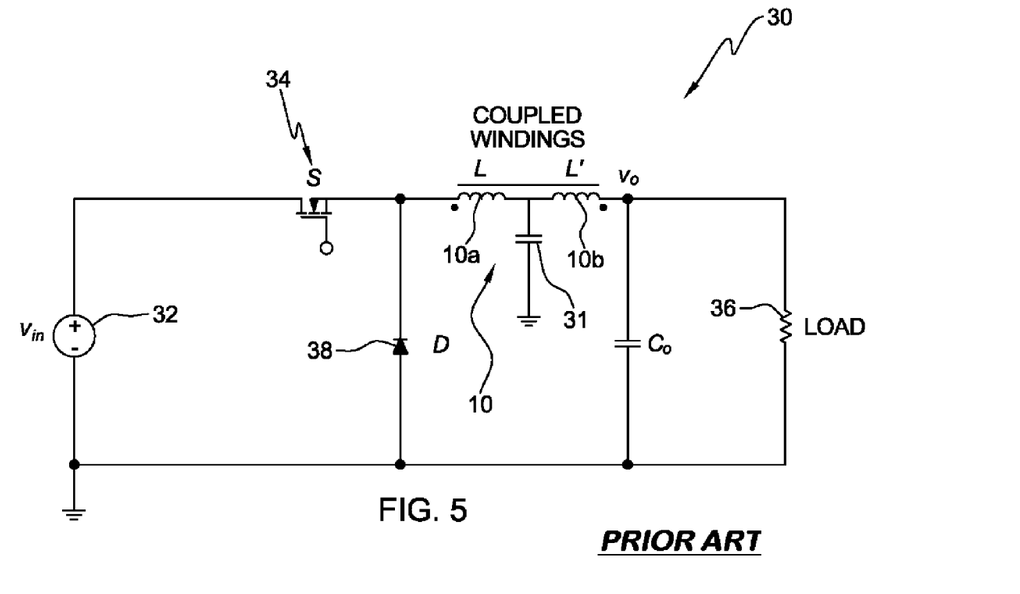
FIG. 5 is a circuit diagram showing how the EPC is canceled with coupled magnetic windings using a prior art technique.

Some coupled magnetic windings are used to nullify the effect of the parasitic capacitance of the inductor. The method is shown in FIG. 5, in which a negative capacitance is developed by configuring an inductor 10 as two inversely or opposed coupled windings 10a, 10b having different number of turns and connecting a capacitor 31 to a center tap between the two windings 10a, 10b. Although the EPC can be canceled, the structure will still produce an inductance in series with the added capacitor 31. Moreover, it cannot cancel the EPR effect and the coupling effect is highly dependent on the magnetic properties of the core materials of the coupled windings 10a, 10b. There are many disadvantages to this approach of addressing the problem of parasitic capacitance.

A prior-art method using the second approach is based on adding an active circuit. The parasitic effects are canceled at the circuit level, but this approach also suffers many problems and does not fully mitigate or obviate the parasitic capacitance effects.

OBJECTS OF THE INVENTION

An object of the invention is to mitigate and/or obviate to some degree one or more problems associated with known methods of reducing parasitic capacitance and/or parasitic resistance of electronic circuits, systems or components of such circuits or systems.

Another object of the invention is to provide means for reducing parasitic capacitance of an inductive part or element of an electronic circuit or system.

Yet another object of the invention is to improve the frequency response characteristics of circuits, systems or components of such circuits or systems.

One skilled in the art will derive from the following description other objects of the invention. Therefore, the foregoing statements of object are not exhaustive and serve merely to illustrate some of the many objects of the present invention. Furthermore, one skilled in the art will understand that the embodiments of the present invention as hereinafter described may address one, some or all of said objects, but may do so only to a limited degree. The statements of objects are defined merely by way of example and are not to be regarded as being requiring to be satisfied by each and every embodiment.

SUMMARY OF THE INVENTION

According to the present invention, there is provided method and apparatus for suppressing or at least reducing the effect of the parallel capacitance and resistance of an electrical component, particularly inductive network, or circuit, on the frequency response of the component and circuit.

In one general aspect of the invention, an apparatus is coupled in parallel with an inductor associated parallel capacitance and resistance. It comprises of an active current source that generates a current counteracting the current through the parasitic capacitance and resistance, so that the effect caused by the parasitic capacitance and resistance can be suppressed or canceled. The magnitude of the active current source is derived by sensing the inductor voltage. The frequency response of the inductor will be enhanced with the capacitance and resistance suppressed.

In another general aspect of the invention, some other forms of non-isolated and isolated structures can be derived. The inductor voltage can be sensed and the output current can be generated by non-isolated and isolated means.

In accordance with a main aspect of the invention, there is provided a method of reducing a parasitic effect in an electronic circuit or system. The method comprises identifying a part of the electronic circuit or system that exhibits inductance, determining a value of a parallel parasitic effect associated with the part of the electronic circuit or system that exhibits inductance, sensing a voltage signal across part of the electronic circuit or system, and determining from the sensed voltage signal and the value of the parallel parasitic effect a parasitic current associated with the part of the electronic circuit or system. The method further comprises adding a current source in parallel with the part of the electronic circuit or system, the current source being arranged to deliver a compensating current of generally equal magnitude but generally opposite phase to the determined parasitic current.

Preferably, the added current source comprises an active current source.

The added current source may be implemented using any of a passive circuit; a linear-type voltage source; or a switched-mode voltage source.

Where the parallel parasitic effect comprises a parallel capacitive effect, the steps of determining from said sensed voltage signal and said value of the parallel parasitic effect a parasitic current associated with said part of the electronic circuit or system and adding a current source in parallel with said part of the electronic circuit or system may comprise using a differentiator circuit to differentiate the sensed voltage signal and using a current driver circuit to generate the compensating current.

Where the parallel parasitic effect comprises a parallel resistive effect, the steps of determining from said sensed voltage signal and said value of the parallel parasitic effect a parasitic current associated with said part of the electronic circuit or system and adding a current source in parallel with said part of the electronic circuit or system may comprise using a multiplier circuit to determine the compensating current from the sensed voltage signal and using a current driver circuit to generate the compensating current.

Where the parallel parasitic effect comprises both a parallel capacitive effect and a parallel resistive effect, the steps of determining from said sensed voltage signal and said value of the parallel parasitic effect a parasitic current associated with said part of the electronic circuit or system and adding a current source in parallel with said part of the electronic circuit or system may comprise using a differentiator circuit to differentiate the sensed voltage signal to determine a first compensating current for the parallel capacitive effect, using a multiplier circuit to determine a second compensating current from the sensed voltage signal for the parallel resistive effect and using a single current driver circuit to generate a combined compensating current comprising said first and second compensating currents.

The part of the electronic circuit or system may comprise any of an electronic system, a printed circuit board 'PCB', or a component or element on said PCB such as an inductor, a diode, a transistor, or closely spaced wires or board traces.

In accordance with another main aspect of the invention, there is provided an electronic circuit or system, comprising means for determining a value of a parallel parasitic effect associated with a part of the electronic circuit or system that exhibits inductance, means for sensing a voltage signal across the part of the electronic circuit or system, means for determining from the sensed voltage signal and the value of the parallel parasitic effect a parasitic current associated with the part of the electronic circuit or system, and a current source in parallel with the part of the electronic circuit or system, the current source being arranged to deliver a compensating current of generally equal magnitude but generally opposite phase to the determined parasitic current.

Preferably, the added current source comprises an active current source.

The added current source may comprise any of a passive circuit; a linear-type voltage source; or a switched-mode voltage source.

Where the parallel parasitic effect comprises a parallel capacitive effect, the electronic circuit or system may comprise a differentiator circuit to differentiate the sensed voltage signal and a current driver circuit to generate the compensating current.

Where the parallel parasitic effect comprises a parallel resistive effect, the electronic circuit or system may comprise a multiplier circuit to determine the compensating current from the sensed voltage signal and a current driver circuit to generate the compensating current.

Where the parallel parasitic effect comprises both a parallel capacitive effect and a parallel resistive effect, the electronic circuit or system may comprise a differentiator circuit to differentiate the sensed voltage signal to determine a first compensating current for the parallel capacitive effect, a multiplier circuit to determine a second compensating current from the sensed voltage signal for the parallel resistive effect and a single current driver circuit to generate a combined compensating current comprising said first and second compensating currents.

The part of the electronic circuit or system may comprise any of an electronic system, a printed circuit board 'PCB', or a component or element on said PCB such as an inductor, a diode, a transistor, or closely spaced wires or board traces.

In accordance with another main aspect of the invention, there is provided a method of reducing a parasitic effect in an electronic circuit. The method comprises determining a value of a parallel parasitic effect associated with an inductor in the electronic circuit, sensing a voltage signal across the inductor, determining from the sensed voltage signal and the value of the parallel parasitic effect a parasitic current associated with the inductor, and adding a current source in parallel with the inductor, the current source being arranged to deliver a compensating current of generally equal magnitude but generally opposite phase to the determined parasitic current.

In accordance with another main aspect of the invention, there is provided an electronic circuit. The electronic circuit comprises an inductor, means for sensing a voltage signal across the inductor, means for determining from the sensed voltage signal and a value of a parallel parasitic effect a parasitic current associated with the inductor, and a current source in parallel with said inductor, the current source being arranged to deliver a compensating current of generally equal magnitude but generally opposite phase to the determined parasitic current.

BRIEF DESCRIPTION OF THE DRAWINGS

The foregoing and further features of the present invention will be apparent from the following description of preferred embodiments which are provided by way of example only in connection with the accompanying figures, of which.

DETAILED DESCRIPTION OF PREFERRED EMBODIMENTS

The present invention provides a method and system for reducing a parasitic effect in an electronic circuit or system. The method comprises: identifying a part of the electronic circuit or system that exhibits inductance. This can be achieved through testing the circuit or system using known techniques. Alternatively, identification may merely comprise a recognition that a particular component such as an inductor is designed to exhibit inductance and that said level of inductance is a designed feature of said component. A skilled person will be familiar with the many methods of identifying parts of a circuit or system or components of a circuit or system that exhibit some degree of inductance. The method also comprises determining a value of a parallel parasitic effect associated with said part of the electronic circuit or system that exhibits inductance. There are a wide range of methods for measuring parasitic capacitance and again one skilled in the art will be familiar with how such measure is determined or measured. For example, from James C. Chen et al., "An On-Chip, Attofarad Interconnect Charge-Based Capacitance Measurement Technique," IEDM 96-69, IEEE, 0-7803-3393-4, incorporated herein by reference, it is known to connect a test structure and a reference structure to a voltage source and then to discharge the test structure and the reference structure again via a ground potential. In the process, the current flowing during the charging of the reference structure and the test structure is measured, and the difference is used to calculate a parasitic capacitance which is present in the test structure as opposed to the reference structure. Alternatively, parasitic capacitance can be measured using a conventional inductance-capacitance-resistance (LCR) meter which typically has high resolution and is easy to use. Other techniques include that disclosed in U.S. Pat. No. 6,756,792, which is incorporated herein by reference. As a further alternative, Time-domain reflectometry (TDR) is commonly used as a convenient method of determining the characteristic impedance of a transmission line or quantifying reflections caused by discontinuities along or at the termination of a transmission line. TDR can also be used to measure quantities such as the input capacitance of a voltage probe, the inductance of a Jumper wire, the end-to-end capacitance of a resistor, or the effective loading of a printed circuit board. Element values can be calculated directly from the integral of the reflected or transmitted waveform and these values can be used to measure parasitic capacitance. The method further comprises sensing a voltage signal across said part of the electronic circuit or system and this can be achieved using a voltage sensor of known type. The method also comprises determining from said sensed voltage signal and said value of the parallel parasitic effect a parasitic current associated with said part of the electronic circuit or system; and adding a current source in parallel with said part of the electronic circuit or system; wherein said current source is arranged to deliver a compensating current of generally equal magnitude but generally opposite phase to said determined parasitic current.

The part of the electronic circuit or system identified as exhibiting inductance may comprise any of: an electronic system itself, a printed circuit board 'PCB', or a component or element on said PCB such as an inductor, a diode, a transistor, or closely spaced wires or board traces.

Figure 6:
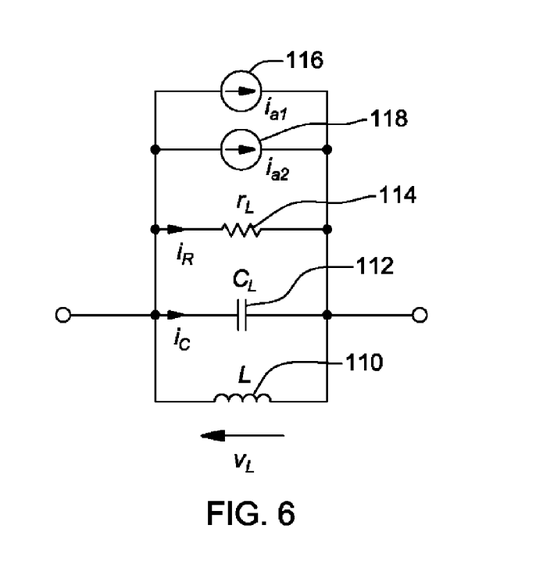
FIG. 6 is a circuit diagram showing how the parasitic components can be canceled with an added current source according to the invention.

The present invention uses an active current or voltage source that generates a compensating signal counteracting the voltage signal across the parasitic capacitance and resistance of a part or component of an electronic circuit or system that exhibits inductance. As shown in FIG. 6, the parasitic currents through the inductor 110 associated with the inductor's EPC $C_L$ 112 and EPR $r_L$ 114 are $i_c$ and $i_R$, respectively. The magnitudes of $i_c$ and $i_R$ are equal to $$i_C = C_L \frac{dv_L}{dt} \quad (1)$$

$$i_R = v_L / r_L \quad (2)$$

In an electronic circuit or system, the effects of $C_L$ and $r_L$ can be canceled by using two auxiliary current sources $i_{a1}$ 116 sources $i_{a1}$ 116 and $i_{a2}$ 118 connected in parallel with the inductor 110 $i_{a1}$ 116 and $i_c$ are equal in magnitude and phase opposition. Thus, $$i_{a1} = -i_C = -C_L \frac{dv_L}{dt} \quad (3)$$

Similarly, $i_{a2}$ and $i_R$ are equal in magnitude and phase opposition. Thus, $$i_{a2} = -i_R = -v_L / r_L \quad (4)$$

The two current sources 116, 118 can be implemented by passive circuits, linear-type or switched-mode voltage sources, provided that the requirements given in equations (3) and (4) are satisfied.

Figure 7:
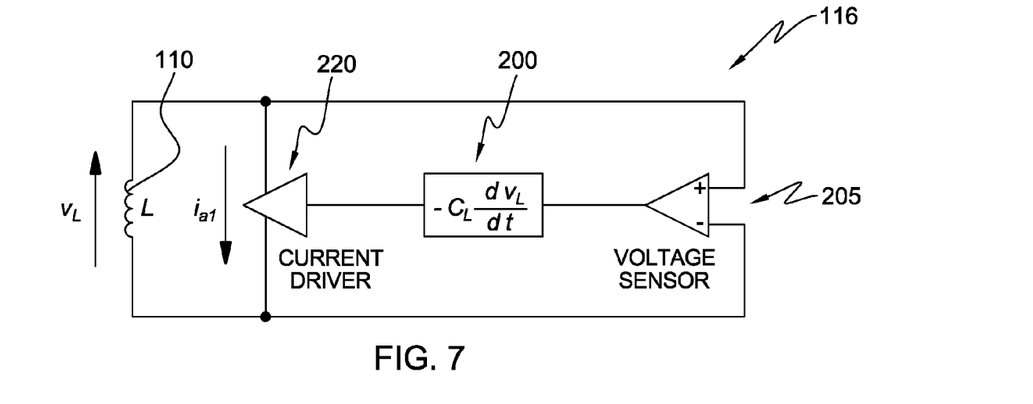
FIG. 7 is a circuit diagram showing a preferred embodiment for generating a compensating current for parallel parasitic capacitance.

A preferred embodiment for $i_{a1}$ 116 is shown in FIG. 7. It consists of two main parts. The first part is a differentiator circuit 200 for differentiating the sensed inductor voltage $v_L$ to realize equation (3). The second part is a current driver 220 that generates current $i_{a1}$ following the output of the differentiator 200. The preferred embodiment for $i_{a1}$ 116 may include a voltage sensor 205 for sensing the voltage signal across the inductor 110 or across any part or component of an electronic circuit or system which exhibits inductance and has associated therewith parasitic capacitance that would usefully be compensated to enhance the frequency response of the electronic circuit or system.

It will be understood that implementing a current source as proposed using the embodiment of FIG. 7 will, to some degree, compensate for the parasitic capacitance of an inductive component or part of a circuit or system and may by itself be sufficient to improve the frequency response of the circuit or system without adding any means for compensating for any parallel parasitic resistance effect caused by said component or part of the electronic circuit or system.

Figure 8:
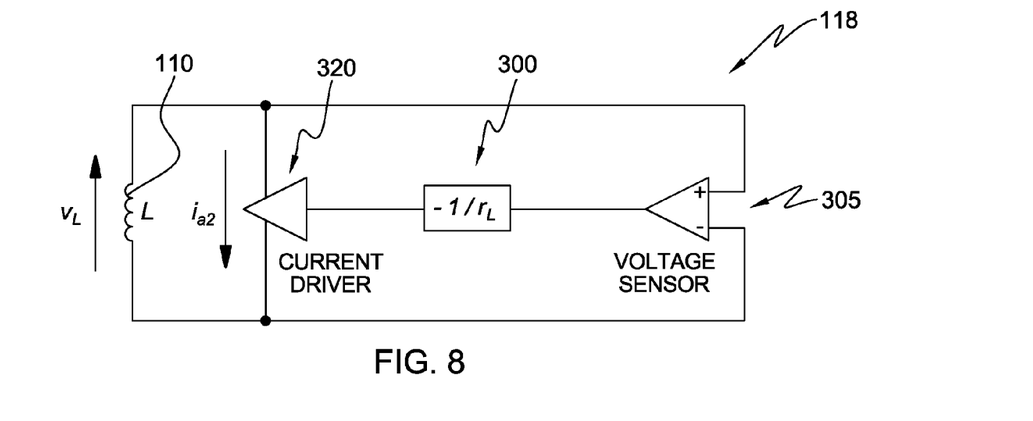
FIG. 8 is a circuit diagram showing a preferred embodiment for generating a compensating current for parallel parasitic resistance.

A preferred embodiment for current source $i_{a2}$ 118 is shown in FIG. 8. It also comprises two main parts. The first part is a multiplier circuit 300 for multiplying $-1/r_L$ and $v_L$ to realize equation (4). The second part is a current driver 320 that generates current $i_{a2}$. The preferred embodiment for current source $i_{a2}$ 118 may include a voltage sensor 305 for sensing the voltage signal across the inductor 110 or across any part or component of an electronic circuit or system which exhibits inductance and has associated therewith parasitic resistance that would usefully be compensated to enhance the frequency response of the electronic circuit or system.

It will be understood that implementing a current source as proposed using the embodiment of FIG. 8 will, to some degree, compensate for the parasitic resistance of an inductive component or part of a circuit or system and may by itself be sufficient to improve the frequency response of the circuit or system without adding any means for compensating for any parallel parasitic capacitance effect caused by said component or part of the electronic circuit or system.

Figure 9:
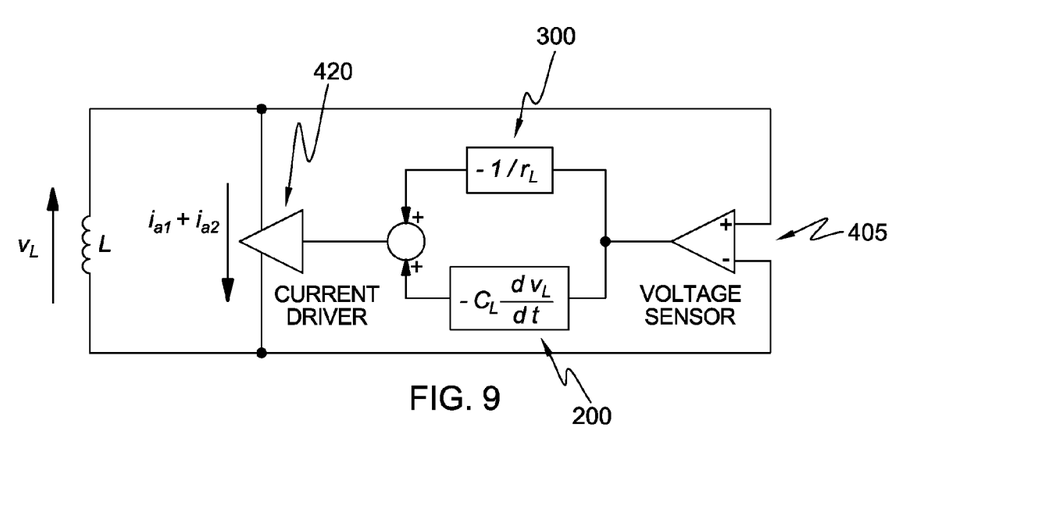
FIG. 9 is a circuit diagram showing a preferred embodiment for generating a combined compensating current for parallel parasitic capacitance and resistance.

The two current sources 116 and 118 can, however, be implemented together to compensate for both parallel parasitic capacitance and resistance of a component or part of a circuit or system exhibiting inductance. In this embodiment, only a single current driver 420, as shown in FIG. 9, need be provided. The input of the current driver 420 is the sum of the differentiator 200 and multiplier circuit 300 outputs. The circuit can be further simplified by providing a single a voltage sensor 405 whose output is provided to both the differentiator 200 and multiplier circuit 300.

The magnitude of $i_{a1}+i_{a2}$ is in the order of a few mA. Thus, the required power rating of the current driver is low, even if the inductor voltage is large.

It will be appreciated that the embodiments of any of FIGS. 7 to 9 can be implemented in integrated circuit 'IC' form or by any other suitable electronic components known to one skilled in the art.

The two current sources 116, 118 of FIGS. 7 and 8, respectively, or the combined current source of FIG. 9 may comprise an active current source. The two current sources 116, 118 of FIGS. 7 and 8, respectively, or the combined current source may be implemented using any of: a passive circuit; a linear-type voltage source; or a switched-mode voltage source.

Active current sources are often used in place of resistors in analog integrated circuits to generate a current without causing attenuation at a point in the signal path to which the current source is attached. The collector of a bipolar transistor, the drain of a field effect transistor, or the plate of a vacuum tube naturally behave as current sources (or sinks) when properly connected to an external source of energy (such as a power supply) because the output impedance of these devices is naturally high when used in the current source configuration.

A JFET can be made to act as a current source by tying its gate to its source. The current then flowing is the $I_{DSS}$ of the FET. These can be purchased with this connection already made and in this case the devices are called current regulator diodes or constant current diodes or current limiting diodes (CLD). An enhancement mode N channel MOSFET can also be used as a current source.

Figure 10:
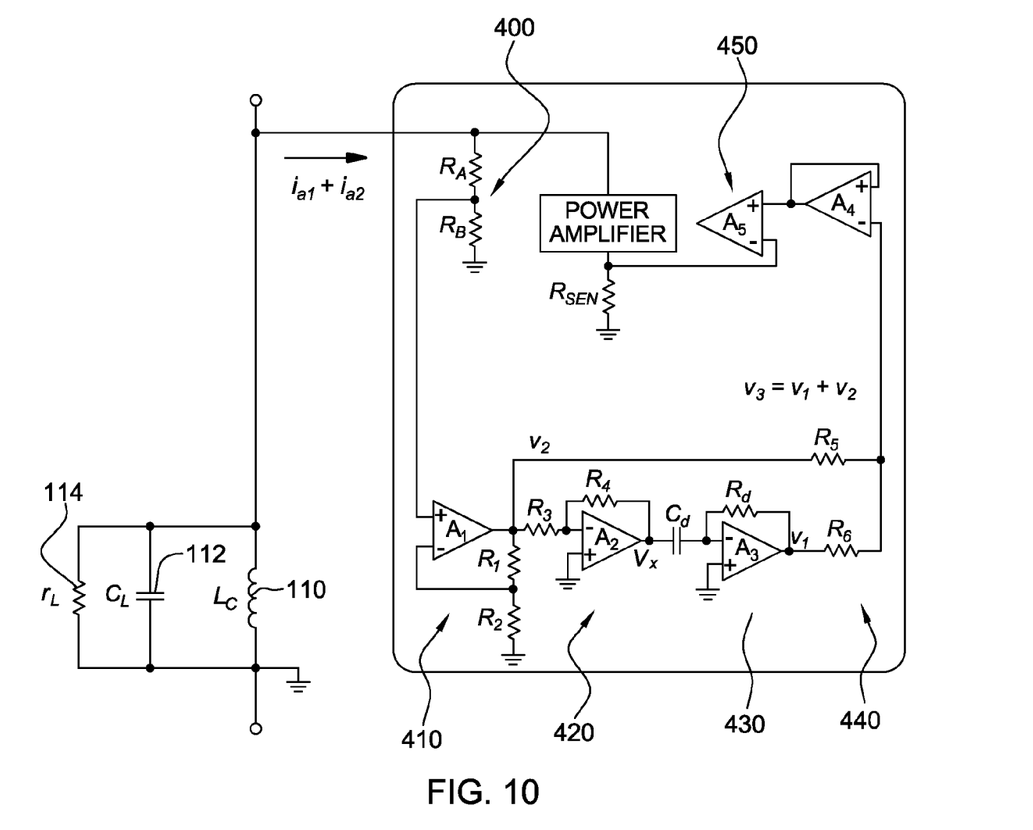
FIG. 10 is a circuit diagram showing a practical implementation of the preferred embodiment of FIG. 9.

A practical implementation of the embodiment of a combined current source of FIG. 9 is shown in FIG. 10. In operation, the voltage signal of the inductor 110 is sensed by a sensing element 400, such as the resistive network formed by the resistors $R_A$ and $R_B$, hall-effect voltage transducer, and voltage transformer, etc. The sensed voltage is amplified by a non-inverting amplifier 410 formed by the operational amplifier $A_1$, $R_1$, and $R_2$. The values of $R_1$ and $R_2$ are designed to make the amplifier output $v_2$ equal to $$v_2 = -v_L/r_L \quad (5)$$

$v_2$ is further amplified by an inverting amplifier 420 formed by the operational amplifier $A_2$, $R_3$, and $R_4$. The amplifier output $v_x$ will be differentiated by a differentiator circuit 430 formed by $A_3$, $R_d$, and $C_d$. The values of $R_3$, $R_4$, $R_d$, and $C_d$ will be designed to make the differentiator output $v_1$ equal to $$v_1 = -C_L \frac{dv_L}{dt} \quad (6)$$

The voltages $v_1$ and $v_2$ are added together by a resistive network 440 comprising two resistors, $R_5$ and $R_6$, which are theoretically equal in value, to give the voltage $v_3$. $v_3$ is used to drive a current buffer 450 formed by the amplifier $A_5$ and the sensing resistor $R_{sen}$. The output current is sensed by the $R_{sen}$ that gives the voltage proportional to the output current. The sensed voltage is compared with $v_3$. Therefore, $$i_{a1} + i_{a2} = \frac{v_3}{R_{sen}} \quad (7)$$

Figure 11:
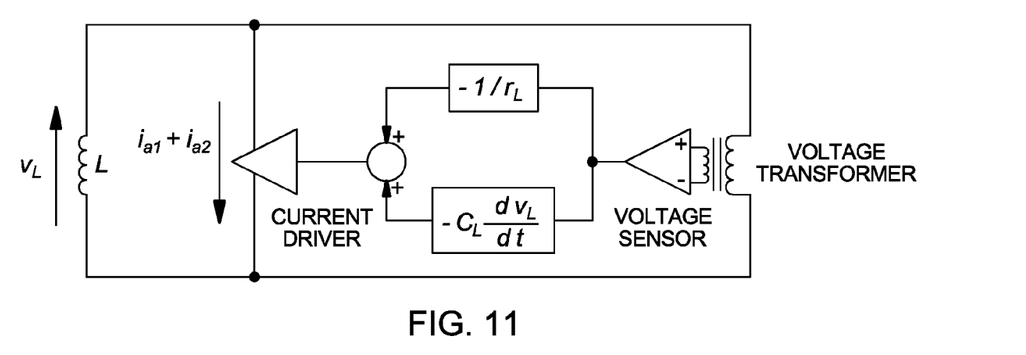
FIG. 11 is a circuit diagram showing the embodiment of FIG. 9 with an isolated input using a voltage transformer.
Figure 12:
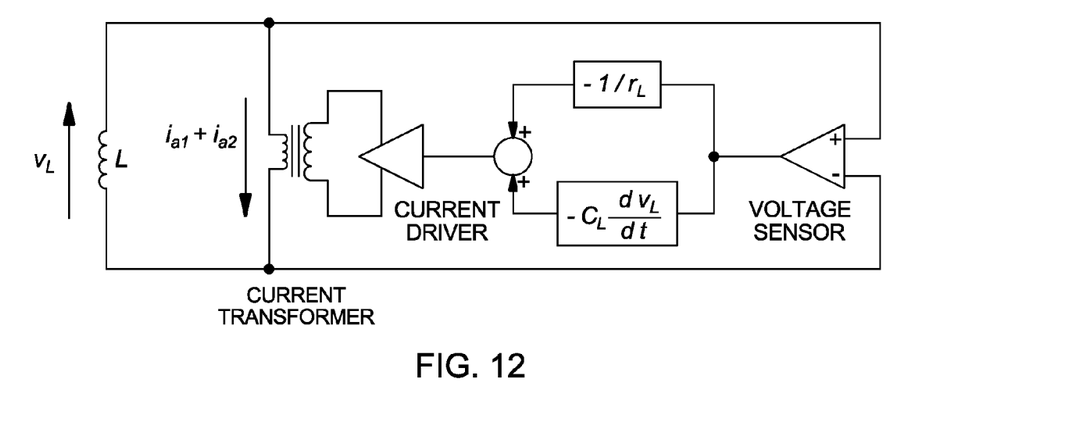
FIG. 12 is a circuit diagram showing the embodiment of FIG. 9 with an isolated output using a current transformer.
Figure 13:
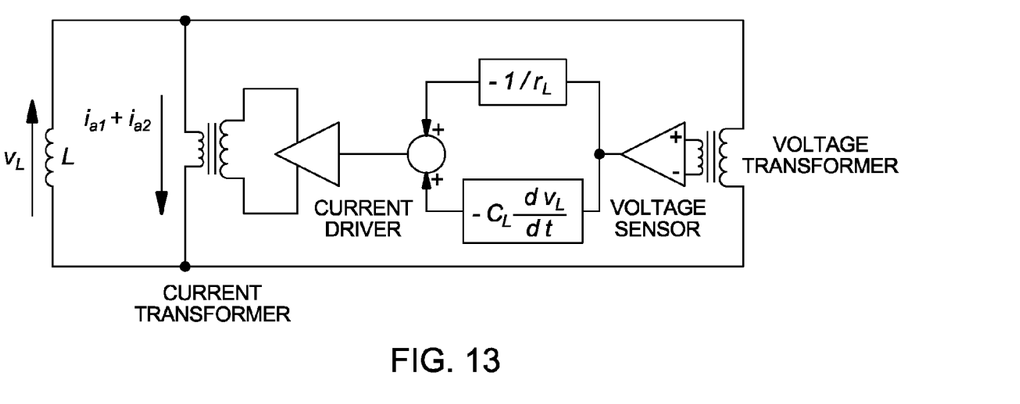
FIG. 13 is a circuit diagram showing the embodiment of FIG. 9 with an isolated voltage input and an isolated current output.

Based on the embodiment of FIGS. 9 and 10, some other forms of the isolated and non-isolated embodiments of the means for compensating the parallel capacitance and resistance of an inductive element, component, circuit or system can be derived and are shown in FIGS. 11 to 13.

FIG. 11 shows the embodiment of FIG. 9 with an isolated input. The inductor voltage is sensed by a voltage transformer. The output is non-isolated and is directly connected to the current driver.

FIG. 12 shows the embodiment of FIG. 9 with an isolated output. The output of the apparatus is connected across the inductor through a current transformer.

FIG. 13 shows the embodiment of FIG. 9 with an isolated input and an isolated output.

While the invention is mainly illustrated and explained in conjunction with an inductive element, it will be understood that the invention is applicable to a wide variety of applications, including the input and output filters of electrical networks, printed circuit boards, transient suppressors, in which it is desirable to cancel the effects of parallel capacitance and/or resistance of a component or circuit. It is understood that the parasitic capacitance and resistance are not limited to a particular component because parasitic capacitance and resistance of other parts of the circuit formed by wiring, printed-circuit board layout may also be addressed with the invention.

In summary, provided is a method and means for reducing or suppressing parasitic capacitance and/or resistive effects that affect the frequency response of components, elements and/or circuits in an electronic circuit or system that exhibit inductance. Noise generated by parasitic capacitance and/or parasitic resistance of the components, the physical orientation of the components, and/or the layout of components, devices and/or conductive tracks (board traces) on printed circuit boards within an electronic circuit or system is reduced. This is achieved by adding a current source in parallel with a part or component of the electronic circuit or system that exhibits inductance, wherein said current source is arranged to deliver a compensating current of generally equal magnitude but generally opposite phase to parasitic current associated with said part or component.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of reducing a parasitic effect in an electronic circuit or system, comprising:
    identifying a part of the electronic circuit or system that exhibits inductance;
    determining a value of a parallel parasitic effect associated with said part of the electronic circuit or system that exhibits inductance;
    sensing a voltage signal across said part of the electronic circuit or system;
    determining from said sensed voltage signal and said value of the parallel parasitic effect a parasitic current associated with said part of the electronic circuit or system; and
    adding a current source in parallel with said part of the electronic circuit or system;
    wherein said current source is arranged to deliver a compensating current of roughly equal magnitude and roughly opposite phase to said determined parasitic current.

2. The method of claim 1, wherein the added current source comprises an active current source.

3. The method of claim 1, wherein the added current source comprises at least one of a passive circuit, a linear-type voltage source, and a switched-mode voltage source.

4. The method of claim 1, wherein the parallel parasitic effect comprises a parallel capacitive effect, and wherein said determining a parasitic current and said adding a current source comprise using a differentiator circuit to differentiate the sensed voltage signal and using a current driver circuit to generate the compensating current.

5. The method of claim 1, wherein the parallel parasitic effect comprises a parallel resistive effect, and wherein said determining a parasitic current and said adding a current source comprise using a multiplier circuit to determine the compensating current from the sensed voltage signal and using a current driver circuit to generate the compensating current.

6. The method of claim 1, wherein the parallel parasitic effect comprises both a parallel capacitive effect and a parallel resistive effect, and wherein said determining a parasitic current and said adding a current source comprise using a differentiator circuit to differentiate the sensed voltage signal to determine a first compensating current for the parallel capacitive effect, using a multiplier circuit to determine a second compensating current from the sensed voltage signal for the parallel resistive effect and using a single current driver circuit to generate a combined compensating current comprising said first and second compensating currents.

7. The method of claim 1, wherein said part of the electronic circuit or system comprises at least one of an electronic system, a printed circuit board 'PCB', and a component or element on a PCB.

8. The method of claim 7, wherein said component or element on a PCB comprises at least one of an inductor, a diode, a transistor, and closely spaced wires or board traces.

9. An electronic circuit or system, comprising:
    means for determining a value of a parallel parasitic effect associated with a part of the electronic circuit or system that exhibits inductance;

means for sensing a voltage signal across said part of the electronic circuit or system;

means for determining from said sensed voltage signal and said value of the parallel parasitic effect a parasitic current associated with said part of the electronic circuit or system; and a current source in parallel with said part of the electronic circuit or system;

wherein said current source is arranged to deliver a compensating current of roughly equal magnitude and roughly opposite phase to said determined parasitic current.

10. The electronic circuit or system of claim 9, wherein the added current source comprises an active current source.

11. The electronic circuit or system of claim 9, wherein the added current source comprises at least one of a passive circuit, a linear-type voltage source, and a switched-mode voltage source.

12. The electronic circuit or system of claim 9, wherein the parallel parasitic effect comprises a parallel capacitive effect, wherein the means for determining the parasitic current comprises a differentiator circuit to differentiate the sensed voltage signal, and wherein the current source comprises a current driver circuit to generate the compensating current.

13. The electronic circuit or system of claim 9, wherein the parallel parasitic effect comprises a parallel resistive effect, wherein the means for determining the parasitic current comprises a multiplier circuit to determine the compensating current from the sensed voltage signal, and wherein the current source comprises a current driver circuit to generate the compensating current.

14. The electronic circuit or system of claim 9, wherein the parallel parasitic effect comprises both a parallel capacitive effect and a parallel resistive effect, wherein the means for determining the parasitic current comprises a differentiator circuit to differentiate the sensed voltage signal to determine a first compensating current for the parallel capacitive effect and a multiplier circuit to determine a second compensating current from the sensed voltage signal for the parallel resistive effect, and wherein the current source comprises a single current driver circuit to generate a combined compensating current comprising said first and second compensating currents.

15. The electronic circuit or system of claim 9, wherein said part of the electronic circuit or system comprises at least one of an electronic system, a printed circuit board 'PCB', and a component or element on said PCB.

16. The method of claim 15, wherein said component or element on a PCB comprises at least one of an inductor, a diode, a transistor, and closely spaced wires or board traces.

17. The electronic circuit or system of claim 9, wherein the means for sensing comprises a voltage sensor.

18. A method of reducing a parasitic effect in an electronic circuit, comprising:

determining a value of a parallel parasitic effect associated with an inductor in the electronic circuit;

sensing a voltage signal across said inductor;

determining from said sensed voltage signal and said value of the parallel parasitic effect a parasitic current associated with said inductor; and adding a current source in parallel with said inductor;

wherein said current source is arranged to deliver a compensating current of roughly equal magnitude and roughly opposite phase to said determined parasitic current.

19. An electronic circuit comprising:

an inductor;

means for sensing a voltage signal across said inductor;

means for determining from said sensed voltage signal and a value of a parallel parasitic effect a parasitic current associated with said inductor; and a current source in parallel with said inductor;

wherein said current source is arranged to deliver a compensating current of roughly equal magnitude and roughly opposite phase to said determined parasitic current.

* * * * *